US009799405B1

(12) United States Patent
Micheloni et al.

(10) Patent No.: US 9,799,405 B1
(45) Date of Patent: Oct. 24, 2017

(54) NONVOLATILE MEMORY SYSTEM WITH READ CIRCUIT FOR PERFORMING READS USING THRESHOLD VOLTAGE SHIFT READ INSTRUCTION

(71) Applicant: IP GEM GROUP, LLC, Irvine, CA (US)

(72) Inventors: Rino Micheloni, Turate (IT); Alessia Marelli, Dalmine (IT); Stephen Bates, Canmore (CA)

(73) Assignee: IP GEM GROUP, LLC, Irvine, CA (US)

( * ) Notice: Subject to any disclaimer, the term of this patent is extended or adjusted under 35 U.S.C. 154(b) by 135 days.

(21) Appl. No.: 14/812,891

(22) Filed: Jul. 29, 2015

(51) Int. Cl.
| G11C 29/00 | (2006.01) |
| G11C 16/26 | (2006.01) |
| G11C 16/14 | (2006.01) |
| G11C 16/34 | (2006.01) |
| G11C 29/52 | (2006.01) |
| G06F 11/10 | (2006.01) |
| G11C 29/50 | (2006.01) |

(52) U.S. Cl.
CPC .......... *G11C 16/26* (2013.01); *G06F 11/1044* (2013.01); *G06F 11/1068* (2013.01); *G11C 16/14* (2013.01); *G11C 16/349* (2013.01); *G11C 29/52* (2013.01); *G11C 2029/5004* (2013.01)

(58) Field of Classification Search
CPC ............ G11C 16/3431; G11C 16/3404; G11C 16/349; G11C 16/0483; G11C 16/3459; G11C 11/5628
See application file for complete search history.

(56) References Cited

U.S. PATENT DOCUMENTS

| 815,137 | A | 3/1906 | Beecher |
| 5,615,235 | A | 3/1997 | Kakuishi et al. |
| 5,732,092 | A | 3/1998 | Shinohara |
| 5,822,244 | A | 10/1998 | Hansen et al. |
| 5,875,343 | A | 2/1999 | Binford et al. |
| 6,115,788 | A | 9/2000 | Thowe |

(Continued)

OTHER PUBLICATIONS

Wu et al. 'Reducing SSD Read Latency via NAND Flash Program and Erase Suspension;' 2012.*

(Continued)

*Primary Examiner* — Guy Lamarre
(74) *Attorney, Agent, or Firm* — Glass & Associates; Kenneth Glass (57) ABSTRACT

A nonvolatile memory system, a nonvolatile memory controller and a method for reducing latency of a memory controller are disclosed. The nonvolatile memory controller includes a storage module configured to store data indicating threshold voltage shift read parameters and corresponding index values. The nonvolatile memory controller includes a status circuit configured to determine at least one usage characteristic of a nonvolatile memory device, and a read circuit configured to determine whether a usage characteristic meets a usage characteristic threshold. When a usage characteristic is determined to meet the usage characteristic threshold, the read circuit is configured to perform all subsequent reads of the nonvolatile memory device using a threshold voltage shift read instruction identified using one or more of the threshold voltage shift read parameters.

20 Claims, 7 Drawing Sheets

(56) References Cited

U.S. PATENT DOCUMENTS

| | | | |
|---|---|---|---|
| 6,148,360 A | 11/2000 | Leak et al. |
| 6,412,041 B1 | 6/2002 | Lee et al. |
| 6,539,515 B1 | 3/2003 | Gong |
| 6,567,313 B2 | 5/2003 | Tanaka et al. |
| 6,633,856 B2 | 10/2003 | Richardson et al. |
| 6,725,409 B1 | 4/2004 | Wolf |
| 6,789,227 B2 | 9/2004 | De Souza et al. |
| 6,871,168 B1 | 3/2005 | Tanaka et al. |
| 6,895,547 B2 | 5/2005 | Eleftheriou et al. |
| 6,934,804 B2 | 8/2005 | Hashemi |
| 6,963,507 B2 | 11/2005 | Tanaka et al. |
| 6,976,194 B2 | 12/2005 | Cypher |
| 6,976,197 B2 | 12/2005 | Faust et al. |
| 7,032,081 B1 | 4/2006 | Gefen et al. |
| 7,050,334 B2 | 5/2006 | Kim et al. |
| 7,116,732 B2 | 10/2006 | Worm et al. |
| 7,206,992 B2 | 4/2007 | Xin et al. |
| 7,209,527 B2 | 4/2007 | Smith et al. |
| 7,237,183 B2 | 6/2007 | Xin |
| 7,324,559 B2 | 1/2008 | McGibney |
| 7,376,015 B2 | 5/2008 | Tanaka et al. |
| 7,450,668 B2 | 11/2008 | Ghosh et al. |
| 7,457,906 B2 | 11/2008 | Pettey et al. |
| 7,472,331 B2 | 12/2008 | Kim et al. |
| 7,484,158 B2 | 1/2009 | Sharon et al. |
| 7,529,215 B2 | 5/2009 | Osterling |
| 7,567,472 B2 | 7/2009 | Gatzemeier et al. |
| 7,620,784 B2 | 11/2009 | Panabaker et al. |
| 7,650,480 B2 | 1/2010 | Jiang |
| 7,694,047 B1 | 4/2010 | Alston |
| 7,708,195 B2 | 5/2010 | Yoshida et al. |
| 7,739,472 B2 | 6/2010 | Guterman et al. |
| 7,752,346 B2 | 7/2010 | Talayco et al. |
| 7,801,233 B1 | 9/2010 | Chow et al. |
| 7,860,930 B2 | 12/2010 | Freimuth et al. |
| 7,904,793 B2 | 3/2011 | Mokhlesi et al. |
| 7,937,641 B2 | 5/2011 | Amidi |
| 7,945,721 B1 | 5/2011 | Johnsen et al. |
| 7,958,430 B1 | 6/2011 | Kolokowsky et al. |
| 7,975,193 B2 | 7/2011 | Johnson |
| 8,094,508 B2 | 1/2012 | Gatzemeier et al. |
| 8,140,930 B1 | 3/2012 | Maru |
| 8,176,367 B2 | 5/2012 | Dreifus et al. |
| 8,219,894 B2 | 7/2012 | Au et al. |
| 8,223,745 B2 | 7/2012 | Johnsen et al. |
| 8,228,728 B1 | 7/2012 | Yang et al. |
| 8,244,946 B2 | 8/2012 | Gupta et al. |
| 8,245,112 B2 | 8/2012 | Hicken et al. |
| 8,245,117 B1 | 8/2012 | Wu |
| 8,250,286 B2 | 8/2012 | Yeh et al. |
| 8,254,112 B2 | 8/2012 | Yang et al. |
| 8,255,770 B2 | 8/2012 | Park et al. |
| 8,259,498 B2 | 9/2012 | Yogev et al. |
| 8,261,136 B2 | 9/2012 | D'Abreu et al. |
| 8,281,217 B2 | 10/2012 | Kim et al. |
| 8,281,227 B2 | 10/2012 | Thatcher et al. |
| 8,286,004 B2 | 10/2012 | Williams |
| 8,307,258 B2 | 11/2012 | Flynn et al. |
| 8,327,220 B2 | 12/2012 | Borchers et al. |
| 8,335,977 B2 | 12/2012 | Weingarten et al. |
| 8,341,502 B2 | 12/2012 | Steiner et al. |
| 8,351,258 B1 | 1/2013 | Yang et al. |
| 8,359,522 B2 | 1/2013 | Gunnam et al. |
| 8,392,789 B2 | 3/2013 | Biscondi et al. |
| 8,402,201 B2 | 3/2013 | Strasser et al. |
| 8,418,023 B2 | 4/2013 | Gunnam et al. |
| 8,429,325 B1 | 4/2013 | Onufryk et al. |
| 8,429,497 B2 | 4/2013 | Tu et al. |
| 8,473,812 B2 | 6/2013 | Ramamoorthy et al. |
| 8,493,791 B2 | 7/2013 | Karakulak et al. |
| 8,504,885 B2 | 8/2013 | Haratsch et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,640,005 B2 | 1/2014 | Wilkerson et al. |
| 8,645,613 B2 | 2/2014 | Tan et al. |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,706,956 B2 | 4/2014 | Cagno et al. |
| 8,707,122 B1 | 4/2014 | Micheloni et al. |
| 8,737,141 B2 | 5/2014 | Melik-Martirosian |
| 8,739,008 B2 | 5/2014 | Liu et al. |
| 8,755,229 B1 | 6/2014 | Beltrami et al. |
| 8,762,620 B2 | 6/2014 | Prins et al. |
| 8,769,374 B2 | 7/2014 | Franceschini et al. |
| 8,775,913 B2 | 7/2014 | Haratsch et al. |
| 8,787,428 B2 | 7/2014 | Dai et al. |
| 8,856,622 B2 | 10/2014 | Ramamoorthy et al. |
| 8,898,372 B2 | 11/2014 | Yeh |
| 8,917,734 B1 | 12/2014 | Brown |
| 8,924,824 B1 | 12/2014 | Lu |
| 8,953,373 B1 | 2/2015 | Haratsch et al. |
| 8,958,247 B2 | 2/2015 | Asaoka et al. |
| 8,959,280 B2 | 2/2015 | Ma et al. |
| 8,984,216 B2 | 3/2015 | Fillingim |
| 8,995,197 B1 | 3/2015 | Steiner et al. |
| 8,995,302 B1 | 3/2015 | Brown et al. |
| 9,025,495 B1 | 5/2015 | Onufryk et al. |
| 9,058,289 B2 | 6/2015 | Tai et al. |
| 9,142,314 B2 | 9/2015 | Beltrami et al. |
| 9,164,891 B2 | 10/2015 | Karamcheti et al. |
| 9,257,182 B2 | 2/2016 | Grunzke |
| 9,294,132 B1 | 3/2016 | Peleato-Inarrea |
| 2002/0051501 A1 | 5/2002 | Demjanenko et al. |
| 2002/0129308 A1 | 9/2002 | Kinoshita et al. |
| 2002/0181438 A1 | 12/2002 | McGibney |
| 2003/0033567 A1 | 2/2003 | Tamura et al. |
| 2003/0104788 A1 | 6/2003 | Kim |
| 2003/0225970 A1 | 12/2003 | Hashemi |
| 2004/0088636 A1 | 5/2004 | Cypher |
| 2004/0123230 A1 | 6/2004 | Lee et al. |
| 2004/0136236 A1 | 7/2004 | Cohen et al. |
| 2004/0181735 A1 | 9/2004 | Xin |
| 2004/0234150 A1 | 11/2004 | Chang |
| 2004/0252791 A1 | 12/2004 | Shen et al. |
| 2004/0268015 A1 | 12/2004 | Pettey et al. |
| 2005/0010846 A1 | 1/2005 | Kikuchi et al. |
| 2005/0226355 A1 | 10/2005 | Kibune et al. |
| 2005/0248999 A1 | 11/2005 | Tamura et al. |
| 2005/0252791 A1 | 11/2005 | Pechtold et al. |
| 2005/0286511 A1 | 12/2005 | Johnsen et al. |
| 2006/0039370 A1 | 2/2006 | Rosen et al. |
| 2006/0050694 A1 | 3/2006 | Bury et al. |
| 2006/0126728 A1 | 6/2006 | Yu et al. |
| 2006/0206655 A1 | 9/2006 | Chappell et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0101225 A1 | 5/2007 | Moon et al. |
| 2007/0118743 A1 | 5/2007 | Thornton et al. |
| 2007/0136628 A1 | 6/2007 | Doi et al. |
| 2007/0147489 A1 | 6/2007 | Sun et al. |
| 2007/0217253 A1 | 9/2007 | Kim et al. |
| 2007/0233939 A1 | 10/2007 | Kim |
| 2007/0239926 A1 | 10/2007 | Gyl et al. |
| 2008/0005382 A1 | 1/2008 | Mimatsu |
| 2008/0016425 A1 | 1/2008 | Khan et al. |
| 2008/0049869 A1 | 2/2008 | Heinrich et al. |
| 2008/0077843 A1 | 3/2008 | Cho et al. |
| 2008/0148129 A1 | 6/2008 | Moon et al. |
| 2008/0229079 A1 | 9/2008 | Flynn et al. |
| 2008/0229164 A1 | 9/2008 | Tamura et al. |
| 2008/0256280 A1 | 10/2008 | Ma |
| 2008/0256292 A1 | 10/2008 | Flynn et al. |
| 2008/0263265 A1 | 10/2008 | Litsyn et al. |
| 2008/0267081 A1 | 10/2008 | Roeck |
| 2008/0276156 A1 | 11/2008 | Gunnam et al. |
| 2008/0320214 A1 | 12/2008 | Ma et al. |
| 2009/0027991 A1 | 1/2009 | Kaizu et al. |
| 2009/0067320 A1 | 3/2009 | Rosenberg et al. |
| 2009/0077302 A1 | 3/2009 | Fukuda |
| 2009/0164694 A1 | 6/2009 | Talayco et al. |
| 2009/0290441 A1 | 11/2009 | Gatzemeier et al. |

(56) References Cited

U.S. PATENT DOCUMENTS

| | | |
|---|---|---|
| 2009/0296798 A1 | 12/2009 | Banna et al. |
| 2009/0303788 A1 | 12/2009 | Roohparvar et al. |
| 2009/0307412 A1 | 12/2009 | Yeh et al. |
| 2009/0327802 A1 | 12/2009 | Fukutomi et al. |
| 2010/0085076 A1 | 4/2010 | Danilin et al. |
| 2010/0162075 A1 | 6/2010 | Brannstrom et al. |
| 2010/0185808 A1 | 7/2010 | Yu et al. |
| 2010/0199149 A1 | 8/2010 | Weingarten et al. |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0262979 A1 | 10/2010 | Borchers et al. |
| 2010/0293440 A1 | 11/2010 | Thatcher et al. |
| 2011/0010602 A1 | 1/2011 | Chung et al. |
| 2011/0055453 A1 | 3/2011 | Bennett et al. |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0161678 A1 | 6/2011 | Niwa |
| 2011/0209031 A1 | 8/2011 | Kim et al. |
| 2011/0225341 A1 | 9/2011 | Satoh et al. |
| 2011/0246136 A1 | 10/2011 | Haratsch et al. |
| 2011/0246842 A1 | 10/2011 | Haratsch et al. |
| 2011/0246853 A1 | 10/2011 | Kim et al. |
| 2011/0296084 A1 | 12/2011 | Nango |
| 2011/0307758 A1 | 12/2011 | Fillingim et al. |
| 2012/0008396 A1 | 1/2012 | Park et al. |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0140583 A1 | 6/2012 | Chung et al. |
| 2012/0141139 A1 | 6/2012 | Bakhru et al. |
| 2012/0166690 A1 | 6/2012 | Regula |
| 2012/0167100 A1 | 6/2012 | Li et al. |
| 2012/0179860 A1 | 7/2012 | Falanga et al. |
| 2012/0203986 A1 | 8/2012 | Strasser et al. |
| 2012/0239991 A1* | 9/2012 | Melik-Martirosian ............ G06F 11/3034 714/708 |
| 2012/0254515 A1 | 10/2012 | Melik-Martirosian et al. |
| 2012/0311388 A1 | 12/2012 | Cronin et al. |
| 2012/0311402 A1 | 12/2012 | Tseng et al. |
| 2013/0013983 A1 | 1/2013 | Livshitz et al. |
| 2013/0024735 A1 | 1/2013 | Chung et al. |
| 2013/0060994 A1 | 3/2013 | Higgins et al. |
| 2013/0086451 A1 | 4/2013 | Grube et al. |
| 2013/0094286 A1 | 4/2013 | Sridharan et al. |
| 2013/0094290 A1 | 4/2013 | Sridharan et al. |
| 2013/0117616 A1 | 5/2013 | Tai et al. |
| 2013/0117640 A1 | 5/2013 | Tai et al. |
| 2013/0145235 A1 | 6/2013 | Alhussien et al. |
| 2013/0163327 A1 | 6/2013 | Karakulak et al. |
| 2013/0163328 A1 | 6/2013 | Karakulak et al. |
| 2013/0176779 A1 | 7/2013 | Chen et al. |
| 2013/0185598 A1 | 7/2013 | Haratsch et al. |
| 2013/0198451 A1 | 8/2013 | Hyun et al. |
| 2013/0205085 A1 | 8/2013 | Hyun et al. |
| 2013/0314988 A1 | 11/2013 | Desireddi et al. |
| 2013/0315252 A1 | 11/2013 | Emmadi et al. |
| 2013/0318422 A1 | 11/2013 | Weathers et al. |
| 2014/0040704 A1 | 2/2014 | Wu et al. |
| 2014/0053037 A1 | 2/2014 | Wang et al. |
| 2014/0068368 A1 | 3/2014 | Zhang et al. |
| 2014/0068382 A1 | 3/2014 | Desireddi et al. |
| 2014/0072056 A1 | 3/2014 | Fay |
| 2014/0085982 A1 | 3/2014 | Asaoka et al. |
| 2014/0101510 A1 | 4/2014 | Wang et al. |
| 2014/0181426 A1 | 6/2014 | Grunzke et al. |
| 2014/0181617 A1 | 6/2014 | Wu et al. |
| 2014/0185611 A1 | 7/2014 | Lie et al. |
| 2014/0198569 A1 | 7/2014 | Kim et al. |
| 2014/0198581 A1 | 7/2014 | Kim et al. |
| 2014/0215175 A1 | 7/2014 | Kasorla et al. |
| 2014/0219003 A1 | 8/2014 | Ebsen et al. |
| 2014/0229774 A1 | 8/2014 | Melik-Martirosian et al. |
| 2014/0281767 A1 | 9/2014 | Alhussien et al. |
| 2014/0281808 A1 | 9/2014 | Lam et al. |
| 2014/0281822 A1 | 9/2014 | Wu et al. |
| 2014/0281823 A1 | 9/2014 | Micheloni et al. |
| 2015/0039952 A1 | 2/2015 | Goessel et al. |
| 2015/0043286 A1 | 2/2015 | Park et al. |
| 2015/0046625 A1 | 2/2015 | Peddle et al. |
| 2015/0127883 A1 | 5/2015 | Chen et al. |
| 2015/0131373 A1* | 5/2015 | Alhussien ............ G11C 16/3431 365/185.02 |
| 2015/0149871 A1 | 5/2015 | Chen et al. |
| 2015/0186055 A1 | 7/2015 | Darragh |
| 2015/0221381 A1 | 8/2015 | Nam |
| 2015/0242268 A1 | 8/2015 | Wu et al. |
| 2015/0332780 A1 | 11/2015 | Kim et al. |
| 2015/0371718 A1 | 12/2015 | Becker et al. |
| 2016/0034206 A1 | 2/2016 | Ryan et al. |
| 2016/0049203 A1* | 2/2016 | Alrod ............ G11C 16/26 714/2 |
| 2016/0071601 A1 | 3/2016 | Shirakawa et al. |
| 2016/0155507 A1 | 6/2016 | Grunzke |
| 2016/0293259 A1 | 10/2016 | Kim et al. |
| 2017/0213597 A1 | 7/2017 | Micheloni et al. |

OTHER PUBLICATIONS

Cai, et al., "Data Retention in MLC NAND Flash Memory: Characterization, Optimization, and Recovery", 2015 IEEE 21st International Symposium on High Performance Computer Architecture (HPCA); Carnegie Mellon University, LSI Corporation, 2015, pp. 551-563.

Chen, et al., "Increasing flash memory lifetime by dynamic voltage allocation for constant mutual information", 2014 Information Theory and Applications Workshop (ITA), 2014, 1-5.

Peleato, et al., "Probabilistic graphical model for flash memory programming", Statistical Signal Processing Workshop (SSP), 2012 IEEE, 2012, pp. 1-4.

Wu, et al., "Reducing SSD Read Latency via NAND Flash Program and Erase Suspension", Proceedings of FAST'2012; Department of Electrical and Computer Engineering Virginia Commonwealth University, Richmond, VA 23284, 2012, pp. 117-123.

NVM Express, Revision 1.0; Intel Corporation; Mar. 1, 2011.

NVM Express, revision 1.0; Intel Corporation; pp. 103-106 and 110-114; Jul. 12, 2011.

* cited by examiner

NONVOLATILE MEMORY SYSTEM WITH READ CIRCUIT FOR PERFORMING READS USING THRESHOLD VOLTAGE SHIFT READ INSTRUCTION

BACKGROUND

Solid state drive (SSD) devices commonly employ NAND flash memory chips and a flash controller to manage the flash memory and to transfer data between the flash memory and a host computer. Uncorrectable Bit Error Rates (UBER) requirements for client and enterprise Solid State Drives (SSD's) are very stringent, requiring UBER of $10^{-15}$ for client SSD's and $10^{-16}$ for enterprise SSD's. Error correction codes have been widely adopted to obtain the low Bit Error Rate (BER) required to achieve these low UBER requirements. Driven by cost, the NAND industry keeps pushing hard on process technology shrink. Technology shrink has been successful in increasing the number of Gbit per $mm^2$, but this success has resulted in increased BER of NAND flash memory chips and SSD's that use NAND flash memory chips.

Standard read operations are performed over the lifetime of the SSD. However, as the NAND devices in the SSD age and are subjected to numerous read, and program and erase cycles, the BER increases, ultimately resulting in decode failures in which the decoding process is unsuccessful in recovering the stored codeword. Conventional Flash Management techniques have extended the lifetime of SSDs by performing a read retry immediately after a failed standard read operation, allowing the SSD to recover the codeword that was not recovered in the original standard read operation. However, the price that is paid for this extension of the SSD's life is increased read latency. When read retry is triggered as a result of a decode failure, the latency of the SSD is increased by the time required to perform the standard read operation plus the time required for the read retry operation. This presents a problem. Accordingly, there is a need for a method and apparatus that will reduce read latency and that will meet stringent UBER requirements.

SUMMARY

A nonvolatile memory controller is disclosed that includes a storage module configured to store data indicating threshold voltage shift read parameters and corresponding index values and a read circuit configured to read a memory address of the nonvolatile memory device using a threshold voltage shift read instruction when an immediately preceding read of the memory address did not result in a decode failure.

In embodiments of the present invention the nonvolatile memory controller includes a storage module configured to store data indicating threshold voltage shift read parameters and corresponding index values and a status circuit configured to determine at least one usage characteristic of a nonvolatile memory device. The nonvolatile memory controller includes a read circuit configured to determine whether a usage characteristic meets a usage characteristic threshold. When a usage characteristic is determined to meet the usage characteristic threshold, the read circuit is configured to perform all subsequent reads of the nonvolatile memory device using a threshold voltage shift read instruction identified using the threshold voltage shift read parameter, wherein the read of the nonvolatile memory device immediately prior to the performing all subsequent reads did not result in a decode failure.

A method for reducing latency of a nonvolatile memory controller is disclosed that includes storing data indicating threshold voltage shift read parameters and corresponding index values, and performing all reads of a nonvolatile memory device using a threshold voltage shift read instruction identified using at least one of the threshold voltage shift read parameters.

A method for reducing latency of a nonvolatile memory controller is disclosed that includes storing data indicating threshold voltage shift read parameters and corresponding index values, determining whether a usage characteristic of a nonvolatile memory device meets a usage characteristic threshold, and when a usage characteristic is determined to meet the usage characteristic threshold, performing all subsequent reads of the nonvolatile memory device using a threshold voltage shift read instruction identified using the stored threshold voltage shift read parameters, wherein a read of the nonvolatile memory device immediately prior to the performing all subsequent reads did not result in a decode failure.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
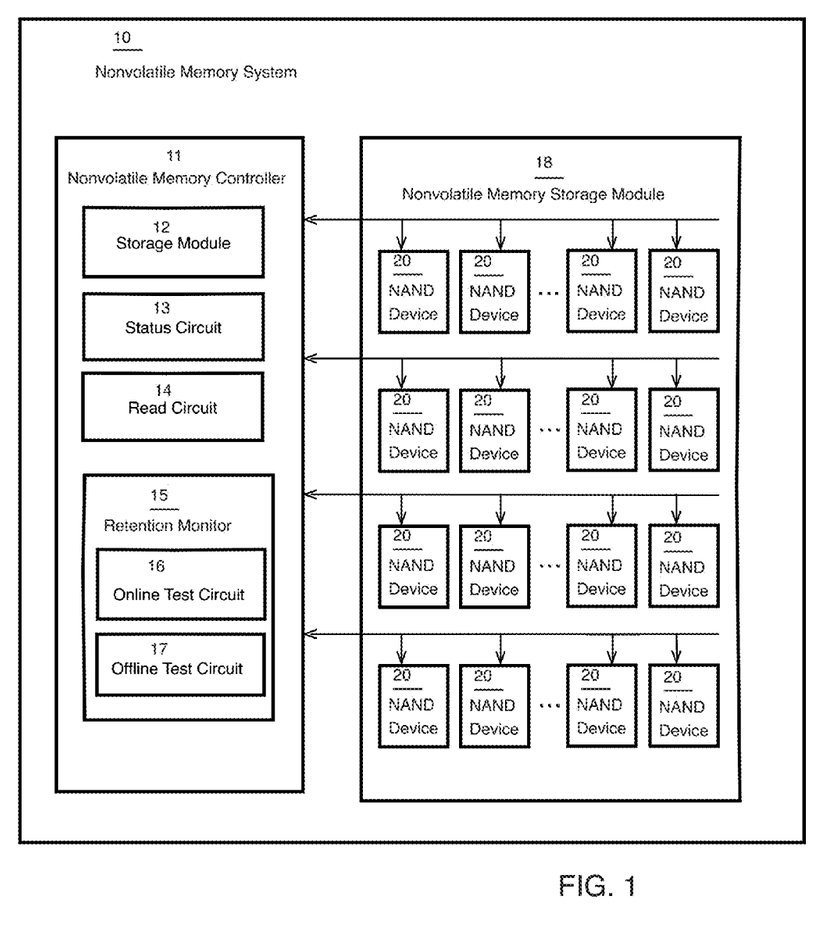
FIG. 1 is a block diagram illustrating a nonvolatile memory system in accordance with an embodiment of the present invention.

A nonvolatile memory system 10 is shown in FIG. 1 to include a nonvolatile memory controller 11 in communication with a nonvolatile memory storage module 18. The nonvolatile memory storage module 18 includes a plurality of nonvolatile memory devices for storing data. In the present embodiment the nonvolatile memory devices are NAND devices 20. In the present embodiment each NAND device 20 is a packaged semiconductor die that is coupled to nonvolatile memory controller 11 by conductive pathways that couple instructions, data and other information between each NAND device 20 and nonvolatile memory controller 11.

Nonvolatile memory controller 11 is configured to perform program operations and read operations on memory cells of nonvolatile memory devices 20. Nonvolatile memory controller 11 includes a storage module 12, a status circuit 13 and a read circuit 14. Storage module 12 is configured to store data indicating threshold voltage shift read parameters and corresponding index values. In one embodiment data indicating threshold voltage shift read parameters and corresponding index values are stored in memory storage on nonvolatile memory controller 11. Alternatively, the data can be stored in one or more NAND devices 20.

Status circuit 13 is configured to determine usage characteristics of NAND devices 20. The determined usage characteristics may be stored in memory storage on nonvolatile memory controller 11. Alternatively, the determined usage characteristics can be stored in one or more NAND devices 20. The term "usage characteristic" as used in the present invention is a value determined during usage of a nonvolatile memory device that indicates the historical usage of the nonvolatile memory device up to a particular point in time (e.g., the number of program and erase cycles, the number of errors in a decoded codeword, the number of reads performed in the block since the last erase operation, etc.).

Nonvolatile memory controller 11 also includes a retention monitor 15 that is operable for performing retention tests during the operation of nonvolatile memory controller 11. Retention monitor 15 includes an online test circuit 16 that is configured to perform online testing and an offline test circuit 17 that is configured to perform offline retention testing.

In one exemplary embodiment each NAND device 20 is coupled to nonvolatile memory controller 11 by chip enable line (CE#), a command latch enable (CLE) line, a read enable signal line (RE#), an address latch enable (ALE) signal line, a write enable single line (WE#), a read/busy (R/B) signal line and input and output (I/O) signal lines.

Figure 2:
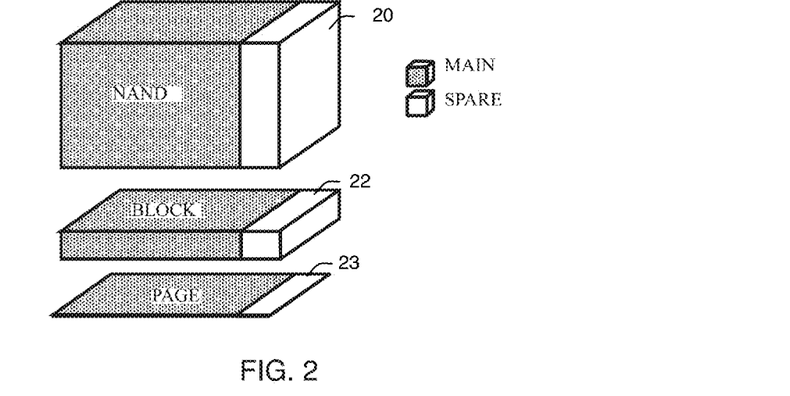
FIG. 2 is block diagram illustrating a memory logic organization in accordance with an embodiment of the present invention.

Referring now to FIG. 2, each NAND device 20 includes memory cells that are organized into blocks 22 and pages 23, with each block 22 composed of NAND strings that share the same group of word lines. A logical page 23 is composed of cells belonging to the same word line. The number of logical pages 23 within logical block 22 is typically a multiple of 16 (e.g. 64, 128). Each logical page 23 is composed of a main data area and a spare area. The main data area may have the size of 4 kB, 8 kB, 16 kB or larger. The spare area is made up of hundreds of bytes for every 4 kB of main data storage area.

In the present embodiment, a logical page 23 is the smallest addressable unit for reading from and writing to the NAND memory and a logical block 22 is the smallest erasable unit. However, it is appreciated that in embodiments of the present invention programming to less than an entire page may be possible, depending on the structure of the NAND array.

Figure 3:
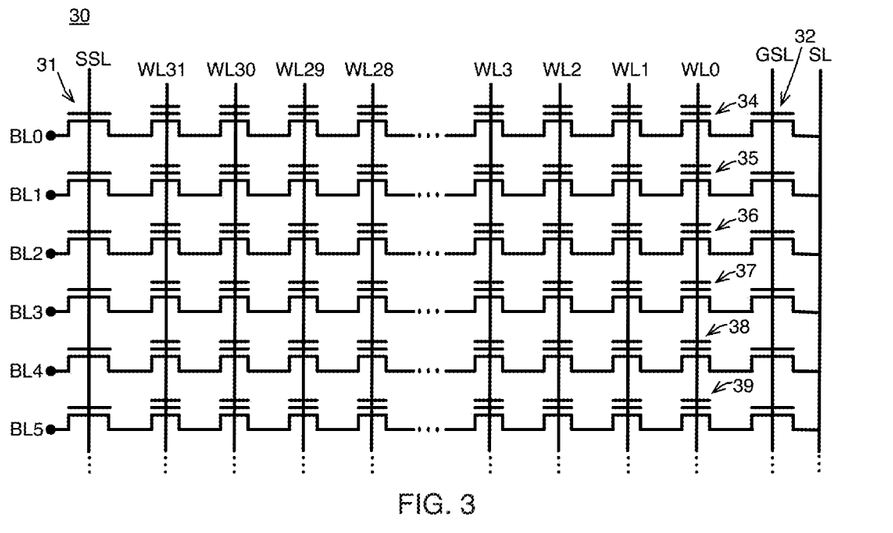
FIG. 3 is a diagram illustrating a NAND array in accordance with an embodiment of the present invention.

An exemplary NAND array 30 is shown in FIG. 3 that is made of memory cells connected in series to form NAND strings. Each NAND string is isolated from the rest of the array by select transistors, such as, for example, select transistor 31 and select transistor 32. Multiple memory cells share the gate voltage (Vg) through a word line, and the drain of one memory cell is the source of the adjacent one. For example, memory cells 34-39 of FIG. 3 share word line 0 (WL0). Though FIG. 2 illustrates an embodiment in which memory cells are single level cells, it is appreciated that NAND devices 20 can also be multi-level cell NAND devices and can store, for example, 2 bits per cell, 3 bits per cell or 4 bits per cell.

In the embodiment shown in FIG. 1 nonvolatile memory controller 11 includes a read circuit 14 that is configured to perform reads of the NAND device 20 using a threshold voltage shift read instruction. In the present embodiment NAND devices 20 are capable of performing a threshold voltage shift read instruction that takes the same amount of time as a standard read (e.g., 100 μs). Therefore, the read does not take any additional time as compared to a standard read. In one embodiment the threshold voltage of the threshold voltage shift read instruction is set by the manufacturer. In another embodiment the threshold voltage to be used to perform the read is set by sending the threshold voltage shift read instruction from nonvolatile memory controller 11 along with a threshold voltage offset value that indicates the amount by which the threshold voltage of the read is to be shifted.

Figure 4:
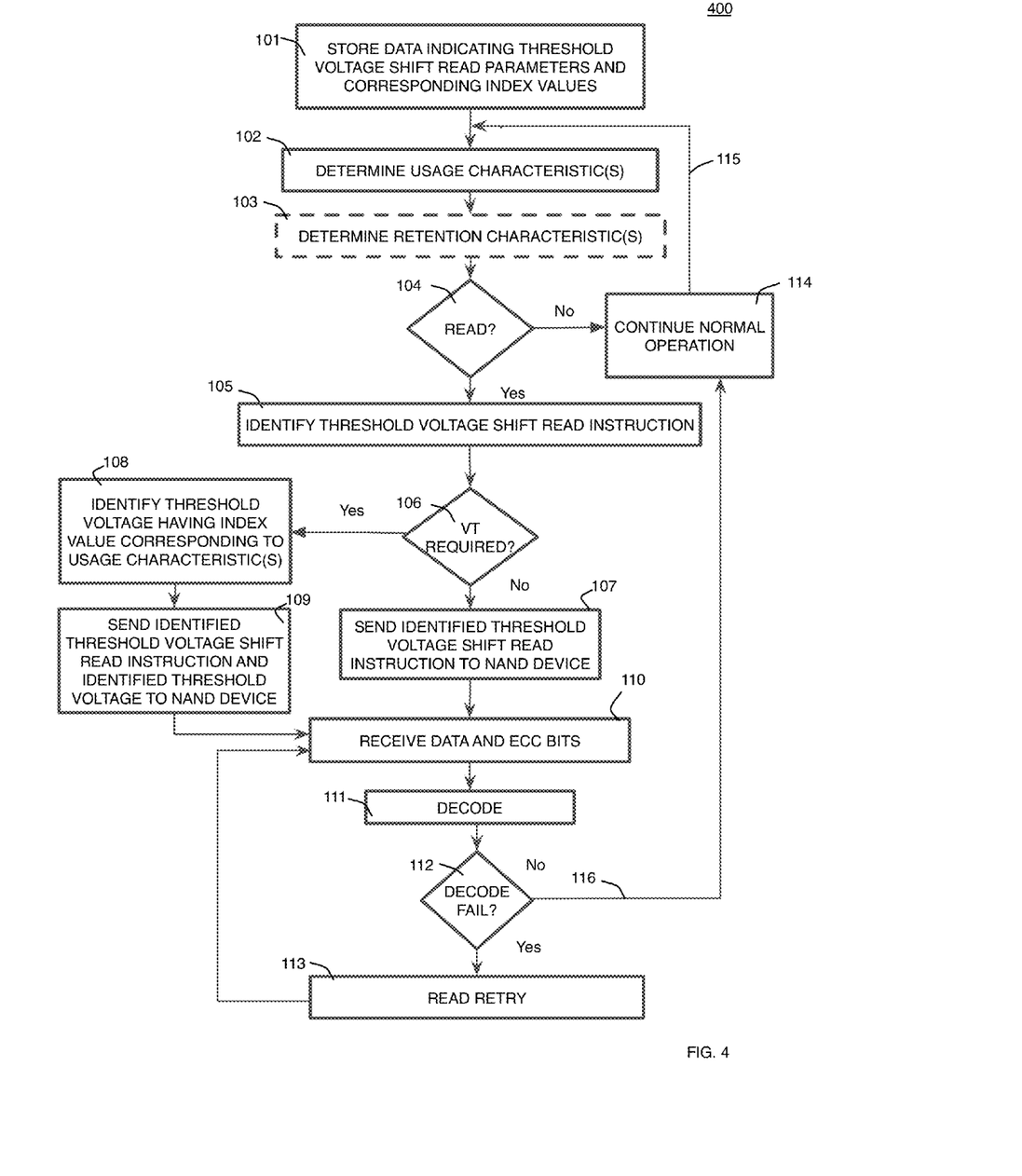
FIG. 4 is a flow diagram illustrating a method for reducing latency of reads of nonvolatile memory devices coupled to a memory controller in which all reads of the nonvolatile memory controller are performed using a threshold voltage shift read instruction in accordance with an embodiment of the present invention.

FIG. 4 illustrates a method 400 for reducing latency of a nonvolatile memory controller that includes storing data indicating threshold voltage shift read parameters and corresponding index values 101. In the present embodiment the stored parameters are stored on nonvolatile memory controller 11 prior to shipping nonvolatile memory controller 11 to the vendor that will integrated the memory controller 11 into a nonvolatile memory system 10. In one alternate embodiment the stored data is uploaded to memory controller 11 after memory controller is assembled to form nonvolatile memory system 10 and storage module 12 is operable to store the data in one or more of NAND devices 150.

Method 400 further includes determining least one usage characteristic of a nonvolatile memory device 102. In the embodiment shown in FIG. 1 status circuit 13 is configured to determine usage characteristic(s) of NAND devices 20 and stores the determined usage characteristics in nonvolatile memory controller 11 or in one or more NAND device 20.

As shown by steps 104-110 all reads of the nonvolatile memory device are performed using a threshold voltage shift read operation. When a read is not being performed the normal operation of the nonvolatile memory controller is resumed as shown by step 114 and arrow 115. More particularly, writes and other operations of the nonvolatile memory controller 11 are performed such as monitoring the operation of NAND devices 20, wear leveling, trash collection, etc.

In the embodiment shown in FIG. 1 read circuit 14 is configured to perform all reads of the NAND device 20 using a threshold voltage shift read instruction that may also be referred to hereinafter a a "$V_T$ shift read instruction." as shown by steps 105-110. More particularly, read circuit 14 is configured to identify a threshold voltage shift read instruction 105 from the parameters stored by storage module 12, determine whether a threshold voltage offset value is required 106 using the stored threshold voltage shift read parameters, identify a threshold voltage offset value 108 using the stored threshold voltage shift read parameters, send the identified threshold voltage shift read instruction 107, and when required send a threshold voltage offset value 109 to the NAND device 20 being read, and receive data and ECC bits 110 from the NAND device being read. Nonvolatile memory controller 11 includes a decoder operable to decode the received data and ECC bits 111, and operable to indicate decode failure 112. Read circuit 14 is configured to receive data and ECC bits from NAND device 20, determine whether decode operation fails 112, and perform read retry operations 113.

In one embodiment read circuit 14 is configured to perform all reads of the NAND device 20 using a threshold voltage shift read instruction. In this embodiment, use of the threshold voltage shift read instruction is not dependent on the previous read of the memory address resulting in a decode failure, but rather, the read is performed using the threshold voltage shift read instruction regardless of the type of read operation that was used to perform the immediately preceding read of the memory address. More particularly, the read is performed using a threshold voltage shift read instruction when the immediately preceding read of the memory address did not result in a decode failure.

When the identified threshold voltage shift read instruction requires that a threshold voltage offset value be provided as shown by step 106 and 108, in one embodiment, the threshold voltage shift read instruction and the threshold voltage offset value are identified 105, 108 using one or more table stored in step 101 indicating threshold voltage shift read instructions, threshold voltage offset values corresponding to each of the threshold voltage shift read instructions that require threshold voltage offset values be provided, and corresponding indexes, that may be referred to hereinafter as a "threshold voltage offset value and threshold voltage shift read instruction table" or as a "$V_T$ offset value and $V_T$ shift read instruction table." The values in the $V_T$ offset value and $V_T$ shift read instruction table(s) are determined by performing testing on exemplary NAND devices that are similar to NAND devices 20 (e.g., the same manufacturer, model, manufacturing batch, etc.) to identify threshold voltages that will minimize Bit Error Rate (BER) for a given set of manufacturing characteristics (manufacturer, model, manufacturing batch, etc.), usage characteristics and a given set of retention characteristics. The table can include index values corresponding to one or more identifying characteristic, index values corresponding to one or more usage characteristic, and index values corresponding to one or more retention characteristic. Steps 105 and 108 may include indexing the table using one or more index value, where the one or more index value may include index values corresponding to one or more identifying characteristic, index values corresponding to one or more usage characteristic, and index values corresponding to one or more retention characteristic to identify a threshold voltage shift read instruction 105 and a threshold voltage offset value 108.

In some applications of nonvolatile memory controller may be custom-configured to work with a single type of NAND device 20 (a single manufacturer, model, manufacturing batch, etc.) In these embodiments there may be only one threshold voltage shift read instruction or at most two threshold voltage shift read instructions that could be used. In these embodiments, the possible threshold voltage shift read instructions may be stored in one or memory location (e.g., in a register of memory controller 11 and not in a table, allowing for the use of a smaller table that only identifies voltage thresholds, that may be referred to hereinafter as a "threshold voltage offset value table" or "$V_T$ offset value table." In this embodiment the parameters stored in step 101 include one or more threshold voltage offset value table indicating threshold voltage offset values and corresponding indexes determined by performing testing on exemplary NAND devices that are similar to NAND devices 20 (e.g., the same manufacturer, model, manufacturing batch, etc.) to identify threshold voltages that will minimize Bit Error Rate (BER) for a given set of identifying characteristics (manufacturer, model, manufacturing batch, etc.), usage characteristics and retention characteristics. The table can include threshold voltage offset values and corresponding index values, including index values corresponding to one or more identifying characteristic, index values corresponding to one or more usage characteristic, and index values corresponding to one or more retention characteristic. Steps 108 may include indexing the table using one or more index value, where the one or more index value may include index values corresponding to one or more identifying characteristic, index values corresponding to one or more usage characteristic, and index values corresponding to one or more retention characteristic to identify the corresponding threshold voltage offset value.

The threshold voltage shift read instruction identified in step 105 and the threshold voltage offset value identified in step 108 are then sent to the NAND device 20 to be read as shown by step 109. In response, data and ECC bits are received 110 at nonvolatile memory controller 11 and the corresponding codeword is decoded 111. In one embodiment the decoding of step 111 uses a 4 kB ECC code such as a Low Density Parity Check (LDPC) code that operates on 4 kB "chunks."

When the identified threshold voltage shift read instruction does not require that a threshold voltage offset value be provided as shown by step 106 and 107, in one embodiment, the threshold voltage shift read instruction can be identified 107 using one or more table stored in step 101 indicating threshold voltage shift read instructions and corresponding identifying (ID) index values that may be referred to hereinafter as a "threshold voltage shift read instruction table" or more simply as a "$V_T$ shift read instruction table," where the (ID) index values distinguish different NAND devices (e.g., the manufacturer, model, manufacturing batch, etc.). In this embodiment threshold voltage shift read instruction is identified by indexing the table using one or more ID index value corresponding to the NAND device 20.

In one embodiment one or more table corresponding to each different type of NAND device is stored in step 101, and a $V_T$ offset value and $V_T$ shift read instruction table, $V_T$ offset value table, or $V_T$ shift read instruction table is selected based on the identifying characteristics of the NAND devices 20 to be used (e.g. manufacturer, model, batch no., etc.). In this embodiment the $V_T$ offset value and $V_T$ shift read instruction table, the $V_T$ shift offset table, the $V_T$ shift read instruction table, and the $V_T$ offset value tables are each specific to a particular manufacturer and model and possibly manufacturing batch of NAND device, and do not include indexes corresponding to identifying characteristics. In this embodiment, steps 107, 108 the table corresponding to the type of NAND device 20 is selected and is indexed using one or more of the usage characteristics and one or more of the retention characteristics. In this embodiment the index values for each threshold voltage shift read instruction or threshold voltage shift read instruction and correspond threshold voltage offset value are determined by performing testing on exemplary NAND devices that are similar to NAND devices 20 (e.g., the same manufacturer, model, manufacturing batch, etc.) to identify threshold voltages that will minimize Bit Error Rate (BER) for a given set of identifying characteristics (manufacturer, model, manufacturing batch, etc.), usage characteristics and a given set of retention characteristics.

The use of tables that indicate the exact threshold voltage shift read instruction to use or the exact threshold voltage offset value to use, as previously discussed is ideal for most applications. However, in high-end nonvolatile memory controllers 11 more flexibility and precision may be required. In these embodiments, the tables do not indicate the exact threshold voltage shift read instruction or the exact threshold voltage offset value to use, but rather indicate the bit error rate corresponding to a particular set of index values (e.g., index values corresponding to one or more identifying characteristic, index values corresponding to one or more usage characteristic, and index values corresponding to one or more retention characteristic). These tables may be referred to hereinafter jointly as "BER table(s)" or more particularly as a "$V_T$ offset value and $V_T$ shift read instruction BER table," a "$V_T$ offset value BER table" and a "$V_T$ shift read instruction BER table." In these embodiments read circuitry 14 is operable for determining the threshold voltage shift read instruction to use and the threshold voltage offset value to use by comparing the BER of all threshold voltage shift read instructions and threshold voltage offset value combinations stored in step 101 having index values corresponding to the characteristics of the NAND device 20 being read. In the present embodiment one or more of the BER tables are indexed using one or more of the following: one or more identifying characteristic, one or more usage characteristic and one or more retention characteristic to determine the voltage shift read instruction and the threshold voltage offset value having the lowest BER.

The construction of the $V_T$ offset value and $V_T$ shift read instruction table, the $V_T$ offset value table, the $V_T$ shift read instruction table, the $V_T$ offset value table and $V_T$ shift read instruction BER table, the $V_T$ offset value BER table and the $V_T$ shift read instruction BER table, can be generated by analysis of test semiconductor devices having characteristics similar to the NAND device 20 being read, in a testing environment, prior to shipping a nonvolatile memory controller 11 to a customer.

In the event that a decode failure occurs as shown by steps 112 and 113, a read retry operation is performed. Read retry operations are operations that immediately follow a decode failure 111-113 and address the same memory address as the read operation that experienced the decode failure 111-113. A decode failure occurs when the ECC used to perform decoding 111 fails to recover the codeword. Read retry operations typically use a threshold voltage shift read instruction to read a given memory address a second time. However, conventionally, read retry operations are performed only after a decode failure 111-113 (when the immediately preceding read of a memory address has resulted in a decode failure 111-113) and are only used to read the same memory address that resulted in decode failure 111-113. Read retry operations are undesirable as they significantly increase the latency of the memory controller 11.

In method 400 all reads are performed using a threshold voltage shift read instruction, with the threshold voltage shift read instruction that is to be sent to the NAND device 20 corresponding to the type of NAND device 20 being read and the types of read instructions that the NAND device 20 that is being read is capable of receiving. The threshold voltage shift read parameters can include different types of threshold voltage shift reads, such as, threshold voltage shift read operations that require that the threshold voltage offset value be indicated along with the threshold voltage shift read instruction that have a NAND read time that is the same as the NAND read time of a standard read instruction, threshold voltage shift read operations that require that the threshold voltage offset value be indicated along with the threshold voltage shift read instruction that have a NAND read time that is longer than the NAND read time of a standard read instruction, threshold voltage shift read operations that do not require that the threshold voltage offset value be provided along with the threshold voltage shift read instruction and that have a NAND read time that is the same as the NAND read time of a standard read, and threshold voltage shift read operations that do not require that the threshold voltage offset value be indicated along with the threshold voltage shift read instruction that have a NAND read time that is longer than the NAND read time of a standard read (e.g., enhanced threshold voltage shift read instructions). Enhanced threshold voltage shift read instructions are threshold voltage shift read instructions in which the NAND determines the threshold voltage to use and performs certain algorithms to improve the accuracy of the read operation, and enhanced threshold voltage shift read operations have longer NAND read time than a standard read instruction.

Figure 5:
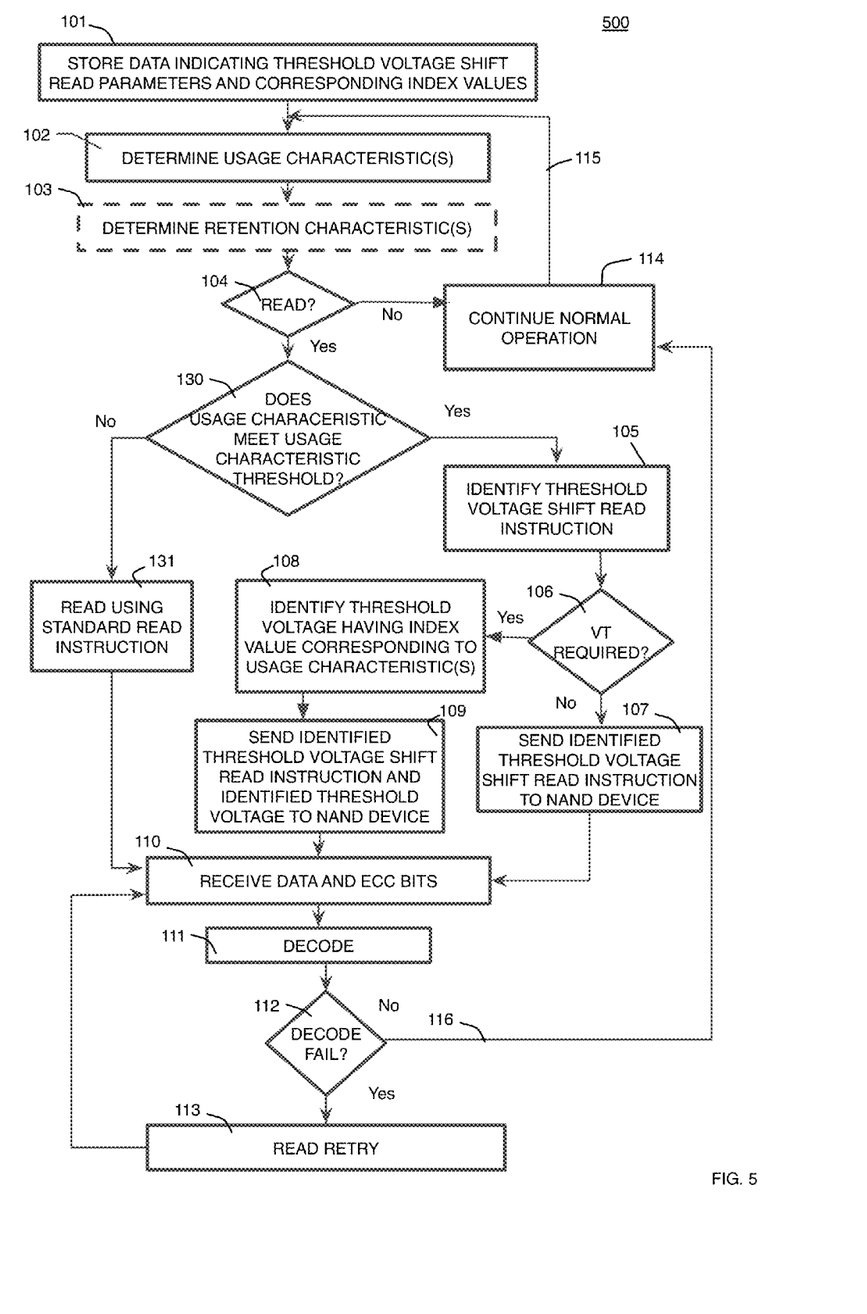
FIG. 5 is a flow diagram illustrating a method for reducing latency of reads of nonvolatile memory devices coupled to a memory controller in which some reads are performed using a standard read instruction and some reads are performed using a threshold voltage shift read instruction in accordance with an embodiment of the present invention.

In one embodiment that is illustrated in FIG. 5, standard reads are performed and, after a predetermined threshold is met, threshold voltage shift reads are performed. More particularly, method 500 includes determining whether a usage characteristic meets a usage characteristic threshold 130 and, after a usage characteristic is determined to meet a usage characteristic threshold 130, all subsequent reads are performed using a threshold voltage shift read instruction as shown by steps 130 and 105-110. When a usage characteristic determined in step 102 does not meet the usage characteristic threshold reads are performed using a standard read instruction 131. In the embodiment shown in FIG. 1, read circuit 14 is configured to determine whether a usage characteristic meets a usage characteristic threshold 130, and when a usage characteristic is determined to meet the usage characteristic threshold, read circuit 14 is configured to perform all subsequent reads of the NAND device 20 using a threshold voltage shift read instruction as shown by steps 130 and 105-110.

In one embodiment read circuit 14 is configured to perform reads of the NAND device 20 using a threshold voltage shift read instruction 105-110. In this embodiment, use of the threshold voltage shift read instruction is not dependent on the previous read of the memory address resulting in a decode failure, but rather, the read is performed using the threshold voltage shift read instruction regardless of the type of read operation that was used to perform the immediately preceding read of the memory address. Accordingly, the read is performed using a threshold voltage shift read instruction when the immediately preceding read of the memory address did not result in a decode failure.

In one embodiment the read of steps 105-110 uses a threshold voltage shift read instruction having a NAND read time that is the same as the NAND read time of the standard read instruction 131. In another embodiment the read of steps 105-110 has a NAND read time that is greater than the NAND read time of the standard read instruction 131, such as, for example, a threshold voltage offset read operation that requires a threshold voltage offset value and that takes longer than the NAND read time of a standard read operation or an enhanced threshold voltage shift read instruction.

The usage characteristic threshold is chosen so as to move from performing a standard read operation 131, 110 to a threshold voltage shift read operation 105-110 before a read using a standard read instruction 131 results in a decode failure as shown by steps 111-113, requiring a read retry operation 113. Thereby, the latency from the read using the standard read instruction 131 and the latency of the read retry 113 is avoided as well as the latency of repeating steps 110-112.

Figure 7:
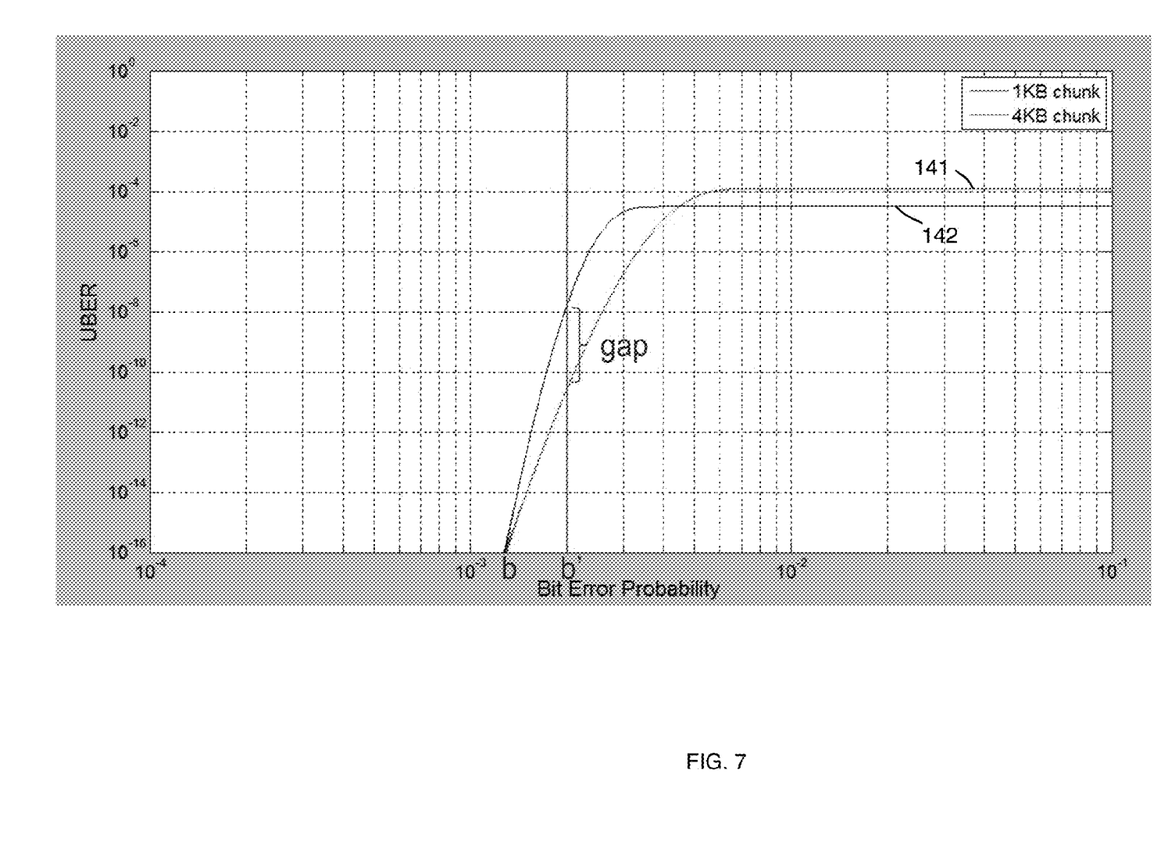
FIG. 7 is a diagram illustrating test results for a test NAND device showing the number of uncorrectable bit errors (UBER) on the vertical axis and bit error probability on the horizontal axis for decoding of a 1 kb chunk and for a 4 kb chunk and illustrates the gap between decoding of a 1 kb chunk versus a 4 kb chunk.

FIG. 7 is a plot of Uncorrectable Bit Error Rate (UBER) vs. Bit Error Rate (BER) showing an exemplary raw BER 141 for decoding a 1 kB codeword and a raw BER 142 for decoding a 4 kB codeword using only a standard read instruction and not using read retry 113. In an enterprise-class SSD an UBER above $10^{-16}$ is not acceptable, imposing a limit on the acceptable raw BER of a NAND device 20 that is shown as point b in FIG. 7. In the present embodiment the usage characteristic threshold is set at a bit error probability that is less than the bit error probability of point b. Thereby read retry 113 is avoided for standard read operations.

Without the reads 105-110 using voltage threshold shift read instructions disclosed in FIGS. 1-5, decode failure read retry mode 113 would have been performed after the bit error probability reached point b, with each standard read failure 131, 110-113 requiring two reads to recover the codeword, the read of steps 131, 110 and the read of step 113, resulting in significantly reduced latency after bit error probability b is reached. Accordingly, by setting the usage characteristic threshold at a bit error rate below bit error rate b, the latency that would have occurred as a result of sending a standard read instruction 131 and read retry 113 is avoided, providing a method and apparatus with reduced latency.

According to coding theory a 4 kB ECC chunk is much more efficient than a 1 kB ECC chunk. More particularly, given the same code rate, a 4 kB ECC decode process shows a better correction capability. Furthermore, given a target correction capability, 4 kB ECC decode process will achieve the target correction capability with a higher code rate. If properly designed a 4 kB ECC chunk and a 1 kB ECC chunk can achieve the same UBER (e.g., a UBER of $10^{-16}$) at the same BER as shown in FIG. 7 up to a BER b. This means that the failure rate is the same for both 1 kB chunks and 4 kB chunks up to BER b. However, referring to lines 141-142 of FIG. 7, it can be seen that, after point b and until lines 141-142 cross, there is a gap between lines 141 and 142, with 4 kB chunks showing a higher UBER than 1 kB chunks (would require more read retry operations), and ECC coding within this range would show a significantly higher latency for a 4 kB ECC code as compared to a 1 kB ECC code, especially at point b', as a result of the latency introduced by the multiple reads performed anytime that read retry is required. The methods and apparatus of the present invention allow for decoding using 4 kB ECC chunks without the increased latency that results from reading using standard read instructions and having to perform numerous read retry operations as a result of decode failures. Therefore, the ECC code can be chosen purely on its merits, without having to resort to smaller, 1 kB chunks in order to maintain latency requirements as is required with prior art systems.

Figure 6:
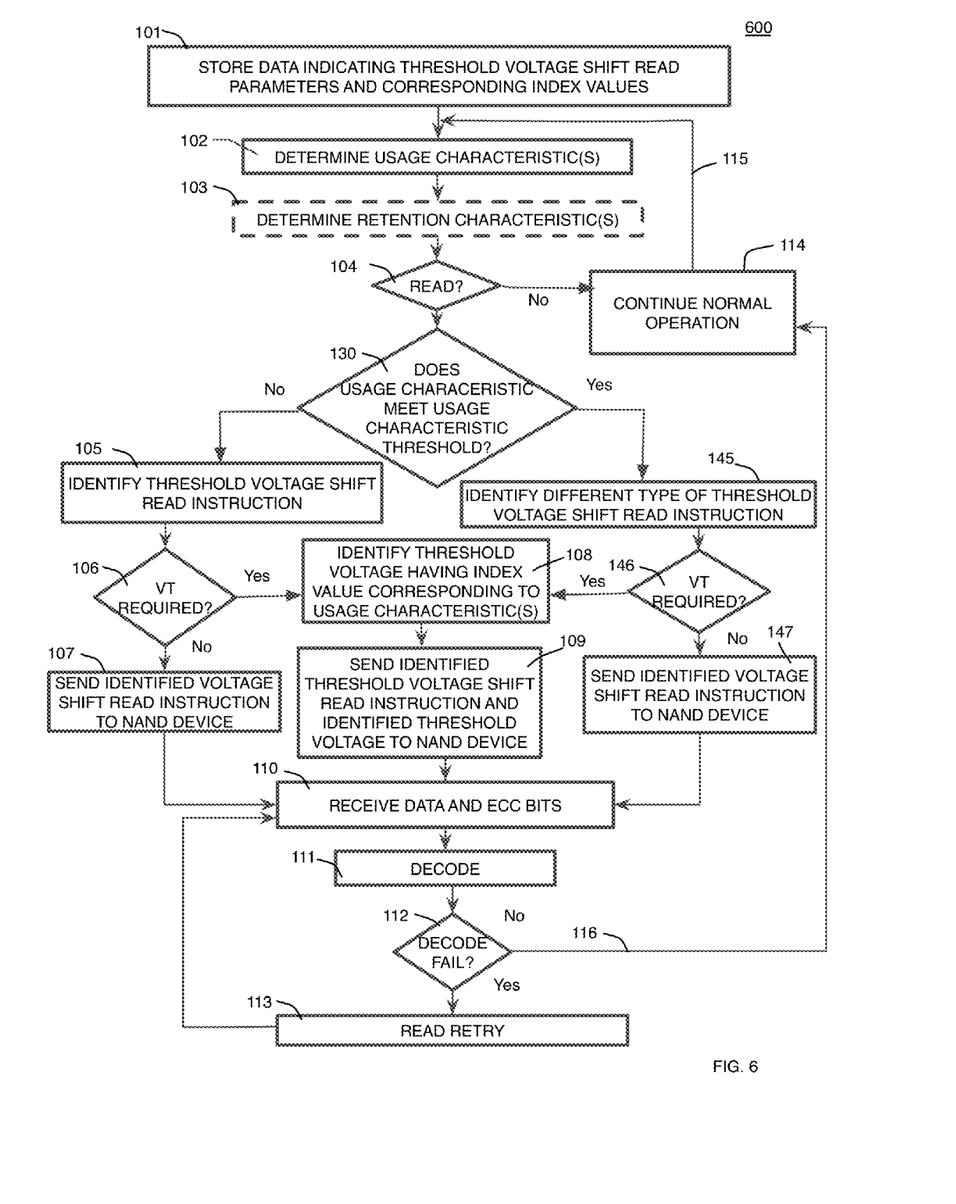
FIG. 6 is a flow diagram illustrating a method for reducing latency of reads of nonvolatile memory devices coupled to a memory controller in which all reads are performed using a threshold voltage shift read instruction and different threshold voltage shift read instructions are used to perform reads in accordance with an embodiment of the present invention.

In the embodiment shown in FIG. 6, all reads are performed using a threshold voltage shift read operations as shown by steps 105-110 and 145-147, 110. The method of FIG. 6 can be used when NAND devices 20 allow for more than one type of threshold voltage shift read operation. In this embodiment read operations are performed as shown by steps 105-110 using a threshold voltage shift read instruction having a fast NAND read time, such as, for example a threshold voltage shift read instruction 105 having the same NAND read time as the NAND read time of a standard read. When a usage characteristic meets a usage characteristic threshold 130 reads are performed using different threshold voltage shift read instructions 145-147. More particularly, a threshold voltage shift read instruction is identified 145 and the identified threshold voltage shift read instruction identified in step 145 is sent to the NAND device 20 to be read 147. If the threshold voltage shift read instruction of step 145 requires that a threshold voltage offset value be provided a threshold voltage offset value is identified as shown by step 146, 108 and the threshold voltage offset value identified in step 108 is sent to the NAND device 20 to be read. In the present embodiment the threshold voltage shift read instruction identified in step 145 will having a longer NAND read time than the thresh voltage shift read instruction identified in step 108, and may be, for example, an enhanced threshold voltage shift read instruction.

In the present embodiment the usage characteristic threshold of step 130 is set so as to go as long as possible using the faster threshold voltage shift reads of steps 105-110, but not so long as to get decode failures 112 that would require read retry 113 prior to switching over to the slower threshold voltage shift read instruction 145-147, 108-110. In one embodiment the threshold voltage shift reads of steps 105-110 use threshold voltage shift read instructions with the same NAND read time as the NAND read time of a standard read instruction (e.g., 100 μs) and the enhanced threshold voltage shift reads of steps 145-147, 108-110 correct up to a higher BER than the reads of steps 105-110 but use enhanced threshold voltage shift read instructions having longer NAND read times (e.g., 130 μs).

In one embodiment the index values are program and erase cycle values and step 102 determines the number of program and erase cycles of the NAND devices 20. In the present embodiment status circuit 13 is configured to determine the number of program and erase cycles after each program and erase cycle of NAND devices 20. In this embodiment step 105, 108, 145 includes identifying a threshold voltage shift read instruction and the threshold voltage offset value corresponding to the determined number of program and erase cycles for the NAND device 20 being read. In the present embodiment read circuit 14 is configured to identify a threshold voltage shift read instruction and a threshold voltage offset value corresponding to the most recently determined number of program and erase cycles for the NAND device 20 being read by indexing one or more table stored in step 101 using the determined number of program and erase cycles of the NAND device 20 being read.

In one embodiment the index values of FIGS. 4-7 are program and erase cycle values, and step 102 includes determining the number of program and erase cycles of the nonvolatile memory device and step 108 includes identifying the threshold voltage offset value of the indicated threshold voltage offset values corresponding to the determined number of program and erase cycles for the nonvolatile memory device. In one specific embodiment a table is stored in step 101 that indicates threshold voltage offset values and corresponding index values that are program and erase cycle values. The table can be generated, for example, by analysis of the characteristics of sample NAND devices in a testing lab prior to shipping nonvolatile memory controller 11 to the customer.

In another embodiment the index values are block read values that indicate the number of reads performed in a block since the last erase operation, and step 102 includes determining the number of reads performed in a block since the last erase operation on the block and steps 105, 145 and 108 include identifying the threshold voltage shift read instruction and threshold voltage offset value corresponding to the determined number of reads performed since the last erase of the block. In one specific embodiment a table is stored in step 101 that indicates threshold voltage offset values and corresponding index values that are block read values.

BER is also a function of temperature. In one embodiment the index values include program and erase cycle values and temperature values, and step 102 includes determining the number of program and erase cycles and the temperature of nonvolatile memory controller 11 and steps 105, 145 and 108 include identifying the threshold voltage shift read instruction and threshold voltage offset value corresponding to the determined number of program and erase cycles and the determined temperature. In one specific embodiment a table is stored in step 101 that indicates threshold voltage offset values and corresponding index values that are program and erase cycle values and temperature values.

In one embodiment the usage characteristic threshold is a threshold number of program and erase cycles. In this embodiment step 102 includes determining a number of program and erase cycles of a NAND device 20 being read, and step 130 includes determining whether the determined number of program and erase cycles for the NAND device 20 exceed the threshold number of program and erase cycles. In this embodiment status circuit 13 is configured to determine the number of program and erase cycles after each program and erase cycle of the NAND device 20, and read circuit 14 is configured to determine whether the most recently determined number of program and erase cycles for the NAND device 20 being read exceed the threshold number of program and erase cycles.

In one embodiment the number of program and erase cycles is used for both the usage characteristic threshold and to determine which threshold voltage to use. In this embodiment, after the usage characteristic is determined to meet the usage characteristic threshold, read circuit 14 is configured to identify a threshold voltage corresponding to the most recently determined number of program and erase cycles for the NAND device 20 being read, and send a threshold voltage shift read instruction to the NAND device 20 that is to be read indicating the memory address and indicating the identified threshold voltage offset value.

In another embodiment the usage characteristic threshold is an error threshold. In this embodiment, each time that a read of a codeword of a nonvolatile memory device is performed by the nonvolatile memory controller, the number of errors in the codeword is determined and step 130 includes determining whether the number of errors in the codeword exceed the error threshold.

In the present embodiment the read circuit 14 is configured to read a memory address of the NAND device 20 using the threshold voltage shift read instruction when an immediately preceding read of the memory address did not result in a decode failure. Also, read circuit 14 is operable to perform a read of a memory address of the NAND device 20 using the threshold voltage shift read instruction, wherein no previous read of the memory address of NAND device 20 has resulted in a decode failure. In the embodiment shown in FIG. 5, a read of the nonvolatile memory device immediately prior to the performing all subsequent reads 105-110 did not result in a decode failure. In one embodiment, at step 111 of FIGS. 4-7, no previous read of the indicated memory address has resulted in a decode failure.

In one embodiment a single usage characteristic is used both in step 130 (compared to the usage characteristic threshold) and in step 105 (used to identify a threshold voltage shift read instruction) and in step 108 (to identify a threshold voltage) such as, for example, the most recently determined number of program and erase cycles for the NAND device 20 being read. However, alternatively, more than one usage characteristic could be determined in step 102 and used. For example, one characteristic can be used in step 130 to determine if the usage characteristic threshold is met and a different characteristic can be used in step 105 to identify a threshold voltage shift read instruction and a different characteristic can be used in step 108 to identify a threshold voltage offset value. Moreover, in embodiments of the present invention more than one usage characteristic is used in step 108 to identify a threshold voltage offset value. In these embodiments, one or more table is stored in step 101 having more than one index (e.g., a first index corresponding to a first usage characteristic and a second index corresponding to a different usage characteristic) corresponding to an indicated threshold voltage offset value.

Methods 400, 500 and 600 can include the optional step of determining at least one retention characteristic 103 of the nonvolatile memory device 20. In this embodiment step 105 includes identifying a threshold voltage shift read instruction and a threshold voltage offset value having an index value corresponding to at least one usage characteristic and having an index value corresponding to at least one retention characteristic. Retention tests are performed during the operation of nonvolatile memory controller 11 to identify retention characteristics. In the present embodiment the retention tests include both offline retention tests and online retention tests.

In the embodiment shown in FIG. 1, nonvolatile memory controller 11 includes retention monitor 15 that is configured to determine retention values. In this embodiment retention monitor 15 is configured to determine retention characteristics of the NAND device 20 being read and the read circuit is configured to identify a threshold voltage shift read instruction (and when required a threshold voltage offset value) corresponding to the usage characteristics and the retention characteristics of the NAND device 20 that is being read. In one embodiment the determined usage characteristic is the number of program and erase cycles and read circuit 14 is configured to identify a threshold voltage shift read instruction and a threshold voltage offset value corresponding to the most recently determined number of program and erase cycles for the NAND device 20 and the determined retention characteristics of the NAND device 20.

In one embodiment a table is stored in step 101 that indicates usage characteristic threshold and a first index corresponding to a usage characteristic and a second index corresponding to a retention characteristic. In another embodiment a table is stored in step 101 that indicates a usage characteristic threshold, a first index corresponding to a usage characteristic, a second index corresponding to a first retention characteristic and a third index corresponding to a second retention characteristic, where the first retention characteristic is an online retention value (e.g., marginal error rate or normalized marginal error rate) and the second retention characteristic is an offline retention value (e.g., delta worst value).

Online test circuit 16 performs online retention tests during normal operation nonvolatile memory controller 11 at certain times, which may be regular intervals of time such as hourly, daily, weekly, monthly or after a predetermined number of operating hours. In one exemplary embodiment, online retention tests are performed after every 12 operating hours of nonvolatile memory controller 11. First, test codewords are read and the number of errors is determined for each codeword that is read. In the present embodiment test codewords are one or more pages that are dedicated to storing data for retention testing. In one embodiment each test codeword is a logical page. Alternatively, a page may contain more than test codeword. The number of test codewords read may be as few as two to three or as many as an entire block of each NAND device 20. In one exemplary embodiment each codeword is a logical page and the online test reads all of the pages of a dedicated test block of a single NAND device 20. The read is performed on a regular basis an interval is that may be, for example, 12, 24, 36 or 48 hours. In the present embodiment the online retention test is performed every 12 operating hours of nonvolatile memory controller 11. Marginal error rate is then determined for the codewords that were read. In one embodiment marginal error rate, that can also be referred to as Delta Read and $\Delta R(t,ts)$ is determined by subtracting the number of errors at time (t) from the number of errors at the following interval (t+ts) as is illustrated by the equation:

$$\Delta R(t,ts) = \#Errors(t+ts) - \#Errors(t).$$

In one embodiment, each time that the test codewords are read, the number of errors are stored for use in the following calculation of marginal error rate.

In one embodiment nonvolatile memory controller 11 includes a temperature sensor that is operable for determining the temperature of the nonvolatile memory controller at the time of the test. Because temperatures can be different between online and offline periods (and they usually are) an acceleration factor (AF) is used to normalize measured retention errors. More particularly, an acceleration factor may be determined that corresponds to the measured temperature using conventional methodology such as, for example, the Arrhenius equation. In one embodiment the determined marginal error rate ($\Delta R$ (t,ts)) is then multiplied by the acceleration factor (AF) to obtain a normalized marginal error rate.

In one embodiment a table that includes marginal error values and temperature values is stored in step 101, and is indexed using the calculated marginal error rate and temperature to determine a corresponding online test index which is then used in steps 105, 108 and 145 to index a $V_T$ offset value and $V_T$ shift read instruction table, $V_T$ offset value table, $V_T$ shift read instruction table, $V_T$ offset value table, $V_T$ shift read instruction BER table, $V_T$ offset value BER table or $V_T$ shift read instruction BER table for identifying a threshold voltage shift read instruction and threshold voltage.

Offline test circuit 17 performs offline retention tests when the memory controller is being shut off and when it is turned back on. In the present embodiment a first portion of the offline retention test is performed as the memory controller is being shut down (e.g., as a part of the shut-down process) and a second part of the offline retention test is performed as the memory controller is restarted (e.g., as a part of the power-on-start-up process) in the next start-up of the nonvolatile memory controller 11.

More particularly, when a power-off indication is received test codewords are read and the number of errors in each codeword is determined. In the present embodiment test codewords are one or more pages that are dedicated to storing data for retention testing. In one embodiment each test codeword is a logical page. Alternatively, a page may contain more than test codeword. The number of test codewords read may be as few as two to three or as many as two to three codewords in each block of each NAND device 20. In one exemplary embodiment only three codewords are read so as to keep shutdown time to a minimum. In another embodiment a page of each block of each NAND device 20 is read.

The highest number of errors in the tested codewords is determined. More particularly, the number of errors in the codeword having the highest number of errors is determined. The highest number of errors can also be referred to as the "worst number of errors". The highest number of errors value is then stored in nonvolatile memory controller 11 or on a NAND device 20 prior to powering off the nonvolatile memory controller 11. In the present embodiment the time ($t_0$) at which test codewords were read is determined and is stored along with the highest number of errors.

The nonvolatile memory controller is then powered off. After powering-on the nonvolatile memory controller at a subsequent time, the codewords that were read prior to the power-off are again read and the number of errors in each codeword is determined as each codeword is decoded. In embodiments in which all of the active codewords are read on startup to refresh active memory pages, the reading of the offline retention test is integrated into the startup-refresh process so as to provide a quick startup of the nonvolatile memory controller 11.

The number of errors in the codeword having the highest number of errors (at the subsequent time) is determined. The after-offline-retention-highest number of errors value may then be stored along with the time of the reading of the codeword having the highest number of errors, that can be referred to as the subsequent read time (t).

A delta worst ($\Delta$Worst) value is calculated by subtracting the number of errors in the codeword having the highest number of errors at time $t_0$ (Worst($t_0$)) from the number of errors in the codeword having the highest number of errors at time t (Worst(t)) and can be represented by the equation:

$$\Delta Worst(t) = Worst(t) - Worst(t_0)$$

where t represents offline time. In one embodiment a table that includes delta worst values and offline times is stored in step 101, and is indexed using the calculated delta worst value and offline time to determine a corresponding offline test index which is then used in steps 105, 108 and 145 to index a $V_T$ offset value and $V_T$ shift read instruction table, $V_T$ offset value table, $V_T$ shift read instruction table, $V_T$ offset value table, $V_T$ shift read instruction BER table, $V_T$ BER table or $V_T$ shift read instruction BER table for identifying a threshold voltage shift read instruction and threshold voltage.

Though the test codewords read in the offline retention test may be codewords stored in NAND devices 20 for the exclusive purpose of retention testing, alternatively, any codeword could be chosen as a test codeword for offline retention testing.

Though the previous discussion describes using both online and offline testing, in one embodiment retention monitor 15 does not include an online test circuit 16 and only offline testing is performed. In an alternate embodiment retention monitor 15 does not include an offline test circuit 17 and only online testing is performed.

In the present embodiment at least one retention characteristic is determined 103 and is used in step 108 for identifying a threshold voltage having index values corresponding to the at least one usage characteristic and the at least one retention characteristic. In the present embodiment retention monitor 15 is operable for determining retention characteristic(s). In one embodiment online test circuit 16 is operable for determining one or more online test value by performing an online retention test. Offline test circuit 17 is operable for determining one or more offline retention value by performing an offline retention test.

In one embodiment step 101 includes storing one or more table that indicates threshold voltage offset values and corresponding index values, where more than one index value corresponds to each indicated threshold voltage offset value. More particularly one or more index corresponds to a usage characteristic and one or more index corresponds to a retention characteristic. In one exemplary embodiment each indicated threshold voltage offset value corresponds to a first index that is a number of program and erase cycles value and a second index that is an online test value and a third index that is an offline test value. This can be in the form of a first table that indexes retention test values into a retention index that can then be used in a second table that indicates threshold voltage offset values.

By using both usage characteristic(s) and retention characteristic(s) a more accurate threshold voltage offset value is determined. Thereby bit error probability is reduced, reducing the bit error rate so as to further delay the onset of decode failures 111-113 that require decode failure read retry mode 113 and extending the useful lifetime of NAND devices 20.

The bit error rate (BER) of the flash memory changes over the lifetime of the device. It is well known that NAND flash memory program and erase (PE) cycling gradually degrades the storage reliability of the memory device. Flash memory PE cycling causes damage to the tunnel oxide of the floating gate transistors in the form of charge trapping in the oxide and interface states. This charge trapping directly results in a shifting of the threshold voltage and gradually degrades the memory device noise margin. Additionally, the BER may change over the lifetime of the flash memory due to a decrease in retention time resulting from the PE cycling of the device.

The methods and apparatus of the present invention provide for selecting a threshold voltage shift read instruction and a corresponding threshold voltage offset value that corresponds to the point in the lifetime of the nonvolatile memory device 20 being read. More particularly, in embodiments in which the use characteristics include the number of program and erase cycles, the determined number of program and erase cycles correspond to a point in the lifetime of the nonvolatile memory device 20 being read, providing a more accurate read of the nonvolatile memory device 20 being read than prior art systems that use standard read instructions.

Figure 8:
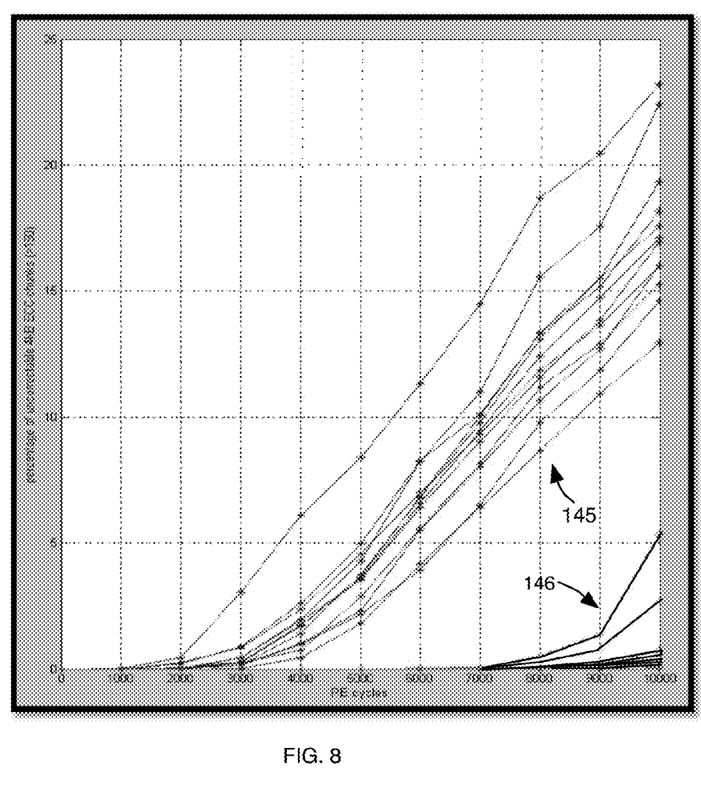
FIG. 8 is a diagram having a vertical axis representing the number of uncorrectable Error Correction Control (ECC) chunks and a horizontal axis representing the number of program and erase (PE cycles) for blocks for an exemplary test NAND device, and illustrates both a standard read operation and an embodiment in which reads are performed using threshold voltage shift read instructions in accordance with an embodiment of the invention.

FIG. 8, shows lines 146 representing the number of errors in each read of a block of a NAND device with 4 kB ECC decoding in accordance with methods 400, 500, 600, 700 of the present invention as compared to lines 145 that represent the number of errors in each read of a block of a NAND device with 4 kB ECC decoding that uses only a standard read instruction. In the prior art, as shown by lines 145, uncorrectable errors begin at 500 PE cycles, leading to significant latency after 500 PE cycles (each read failure will require a read retry). In contrast, the apparatus and method of FIGS. 4-6 of the present invention provide only the latency of the threshold voltage shift read instruction until 7,000 PE cycles are reached. Thereby, the methods and apparatus of the present invention allow for 4 kB ECC decoding, without the corresponding latency resulting from the decode failures shown by lines 145. In addition, it can be seen that the methods and apparatus of the present invention give zero uncorrectable errors up to 7,000 program and erase cycles, which is beyond the product lifetime of most NAND devices 20. Accordingly, not only do the methods and apparatus of the present invention reduce latency, but also, the life of NAND devices 20 is extended as compared to systems that use conventional read operations.

In various embodiments, the system of the present invention may be implemented in a Field Programmable Gate Array (FPGA) or Application Specific Integrated Circuit (ASIC).

Though the method and apparatus of the present invention is described above with respect to a single level memory cell, it is within the scope of the present invention to extend the methods and apparatus of the present invention to MLC (multiple-level cell) devices, as would be evident to one of skill in the art. In this embodiment, the memory cells of NAND devices 20 are multi-level cells and the steps of FIGS. 4-6 are performed using multi-level cells.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for reducing latency of a nonvolatile memory controller comprising:

storing at least one table indicating threshold voltage shift read instructions, threshold voltage offset values and corresponding index values for a nonvolatile memory device;

determining at the nonvolatile memory controller a first usage characteristic of the nonvolatile memory device;

determining, at a nonvolatile memory controller, whether the first usage characteristic is greater than or equal to a usage characteristic threshold; and when the first usage characteristic is determined to be greater than or equal to the usage characteristic threshold, performing all subsequent reads of the nonvolatile memory device by:

indexing the at least one table using an index that corresponds to a second usage characteristic of the nonvolatile memory device to identify the corresponding threshold voltage shift read instruction and the corresponding threshold voltage offset value; and sending the identified threshold voltage shift read instruction and the identified threshold voltage offset value to the nonvolatile memory device.

2. The method of claim 1 wherein the indexing further comprises indexing the at least one table using an index that corresponds to the second usage characteristic to identify a corresponding enhanced threshold voltage shift read instruction, or the corresponding threshold voltage shift read instruction and the corresponding threshold voltage offset value, and wherein the sending further includes sending the identified enhanced threshold voltage shift read instruction or the identified threshold voltage shift read instruction and threshold voltage offset value to the nonvolatile memory device.

3. The method of claim 1 wherein the first usage characteristic is a number of program and erase cycles of the nonvolatile memory device and wherein the usage characteristic threshold comprises a threshold number of program and erase cycles.

4. The method of claim 1 wherein the usage characteristic threshold is an error threshold, the method further comprising:
  each time that a read of a codeword of a nonvolatile memory device is performed by the nonvolatile memory controller, determining the number of errors in the codeword; and
  wherein the determining, at a nonvolatile memory controller, whether the first usage characteristic is greater than or equal to a usage characteristic threshold further comprises determining whether the number of errors in the codeword is greater than or equal to the error threshold.

5. The method of claim 1 wherein the second usage characteristic is a number of program and erase cycles of the nonvolatile memory device.

6. The method of claim 1 wherein the first usage characteristic is the number of program and erase cycles of the nonvolatile memory device, the method further comprising:
  determining a retention characteristic of the nonvolatile memory device; and
  wherein the indexing further comprises indexing the at least one table using an index that corresponds to the determined number of program and erase cycles of the nonvolatile memory device and the determined retention characteristic of the nonvolatile memory device.

7. A method for reducing latency of a nonvolatile memory controller comprising:
  storing at least one table indicating threshold voltage shift read instructions, threshold voltage offset values and corresponding index values; and
  performing all reads of a nonvolatile memory device that is coupled to the nonvolatile memory controller by:
    determining, at the nonvolatile memory controller, a usage characteristic of the nonvolatile memory device;
    indexing the at least one table using an index that corresponds to the determined usage characteristic to identify a corresponding threshold voltage shift read instruction and a corresponding threshold voltage offset value; and
    sending the identified threshold voltage shift read instruction and the identified threshold voltage offset value to the nonvolatile memory device.

8. The method of claim 7 wherein the indexing further comprises indexing the at least one table using an index that corresponds to the determined usage characteristic to identify an enhanced threshold voltage shift read instruction or the corresponding threshold voltage shift read instruction and the corresponding threshold voltage offset value, and wherein the sending further comprises sending the identified enhanced threshold voltage shift read instruction or the identified threshold voltage shift read instruction and the identified threshold voltage offset value to the nonvolatile memory device.

9. The method of claim 7 wherein the nonvolatile memory controller is an integrated circuit device and the nonvolatile memory device is a different integrated circuit device.

10. The method of claim 7 wherein the usage characteristic is the number of program and erase cycles of the nonvolatile memory device.

11. The method of claim 10 further comprising:
  determining a retention characteristic of the nonvolatile memory device; and
  wherein the indexing further comprises indexing the at least one table using an index that corresponds to the determined number of program and erase cycles and the determined retention characteristic of the nonvolatile memory device.

12. A nonvolatile memory controller comprising;
  a storage module configured to store threshold voltage shift read instructions, threshold voltage offset values and corresponding index values, each of the threshold voltage shift read instructions and the threshold voltage offset values associated with one or more of the index values;
  a status circuit configured to determine a first usage characteristic of a nonvolatile memory device; and
  a read circuit configured to determine whether the first usage characteristic is greater than or equal to a usage characteristic threshold and when the first usage characteristic is greater than or equal to the usage characteristic threshold, the read circuit configured to perform all subsequent reads of the nonvolatile memory device by identifying the stored threshold voltage shift read instruction associated with one or more index value that corresponds to a second usage characteristic and identifying the stored threshold voltage offset value associated with one or more index value that corresponds to the second usage characteristic, and sending the identified threshold voltage shift read instruction and the identified threshold voltage offset value to the nonvolatile memory device.

13. The nonvolatile memory controller of claim 12 wherein the identifying further comprises identifying an enhanced threshold voltage shift read instruction, or the stored threshold voltage shift read instruction and the stored threshold voltage offset value associated with one or more index value that corresponds to the second usage characteristic, and wherein the sending further comprises sending the identified enhanced threshold voltage shift read instruction, or the identified threshold voltage shift read instruction and the identified threshold voltage offset value to the nonvolatile memory device.

14. The nonvolatile memory controller of claim 12 wherein the first usage characteristic and the second usage characteristic are a number of program and erase cycles.

15. The nonvolatile memory controller of claim 12 wherein the nonvolatile memory controller is an integrated circuit device and the nonvolatile memory device is a different integrated circuit device.

16. The nonvolatile memory controller of claim 12 wherein the storage module is configured to store at least one table indicating the threshold voltage shift read instructions, the threshold voltage offset values and the corresponding index values, the nonvolatile memory controller further comprising:
  an online test circuit configured to periodically perform an online retention test, the online retention test including reading codewords in test blocks of nonvolatile memory devices electrically coupled to the nonvolatile memory controller, the status circuit configured to determine the number of program and erase cycles after each program and erase cycle of the nonvolatile memory device; and wherein, the identifying the stored threshold voltage shift read instruction associated with one or more index value that corresponds to a second usage characteristic and identifying the stored threshold voltage offset value corresponding to one or more index value that corresponds to the second usage characteristic further includes indexing the at least one table to identify the threshold voltage shift read instruction and the stored threshold voltage offset value associated with one or more index value corresponding to the most recently determined number of program and erase cycles for the nonvolatile memory device and the results from the most recent online retention test.

17. The nonvolatile memory controller of claim 16 further comprising:

an offline test circuit configured to perform an offline retention test by reading codewords of at least one test block at a first time to determine the number of errors in each codeword, determining the number of errors in the codeword having the highest number of errors at the first time, after power off of the memory controller and after powering-on the memory controller at a subsequent time reading the codewords of the at least one test block, determining the number of errors in the codeword having the highest number of errors at the subsequent time, calculating a delta worst value by subtracting the number of errors in the codeword having the highest number of errors at the first time from the number of errors in the codeword having the highest number of errors at the subsequent time; and wherein the identifying the stored threshold voltage shift read instruction associated with the index value that corresponds to a second usage characteristic and identifying the stored threshold voltage offset value associated with the index value that corresponds to the second usage characteristic further includes indexing the at least one table to identify the threshold voltage shift read instruction and the threshold voltage offset value associated with one or more index value corresponding to the most recently determined number of program and erase cycles for the nonvolatile memory device and the delta worst value from the most recent offline retention test.

18. A nonvolatile memory controller comprising:

a storage module configured to store threshold voltage shift read instructions, threshold voltage offset values and corresponding index values, each of the threshold voltage shift read instructions and the threshold voltage offset values associated with one or more of the index values;

a status circuit configured to determine a usage characteristic of a nonvolatile memory device; and a read circuit configured to perform all reads of the nonvolatile memory device by identifying the stored threshold voltage shift read instruction associated with one or more index value that corresponds to a second usage characteristic and identifying the stored threshold voltage offset value associated with one or more index value that corresponds to the second usage characteristic, and sending the identified threshold voltage shift read instruction and the identified threshold voltage offset value to the nonvolatile memory device.

19. The nonvolatile memory controller of claim 18 wherein the stored data comprises a table that includes threshold voltage shift read instructions, threshold voltage offset values and corresponding index values, the nonvolatile memory controller further including:

an online test circuit configured to periodically perform an online retention test, the online retention test including reading codewords in test blocks of the nonvolatile memory device, the status circuit configured to determine the number of program and erase cycles after each program and erase cycle of the nonvolatile memory device and wherein the usage characteristic is the determined number of program and erase cycles; and wherein the identifying the stored threshold voltage shift read instruction associated with one or more index value that corresponds to a second usage characteristic and identifying the stored threshold voltage offset value associated with one or more index value that corresponds to the second usage characteristic further includes identifying the stored threshold voltage shift read instruction and the stored threshold voltage offset value associated with one or more index value corresponding to the most recently determined number of program and erase cycles for the nonvolatile memory device and the results from the most recent online retention test.

20. The nonvolatile memory controller of claim 19 further comprising:

an offline test circuit configured to perform an offline retention test by reading codewords of at least one test block at a first time to determine the number of errors in each codeword, determining the number of errors in the codeword having the highest number of errors at the first time, after power off of the memory controller and after powering-on the memory controller at a subsequent time reading the codewords of the at least one test block, determining the number of errors in the codeword having the highest number of errors at the subsequent time, calculating a delta worst value by subtracting the number of errors in the codeword having the highest number of errors at the first time from the number of errors in the codeword having the highest number of errors at the subsequent time; and wherein the identifying the stored threshold voltage shift read instruction associated with one or more index value that corresponds to a second usage characteristic and identifying the stored threshold voltage offset value associated with one or more index value that corresponds to the second usage characteristic further comprises identifying the stored threshold voltage shift read instruction and the stored threshold voltage offset value associated with one or more index value corresponding to the most recently determined number of program and erase cycles for the nonvolatile memory device and the delta worst value from the most recent offline retention test.

* * * * *